(12) United States Patent
Ikeno

(10) Patent No.: US 6,829,321 B1
(45) Date of Patent: Dec. 7, 2004

(54) HIGH SPEED AND COMPACT OVERFLOW DETECTION FOR SHIFTERS

(75) Inventor: Rimon Ikeno, Ibaraki (JP)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/719,093

(22) Filed: Nov. 21, 2003

(51) Int. Cl.[7] .............................................. G11C 19/00
(52) U.S. Cl. .......................................... 377/64; 377/75
(58) Field of Search ..................................... 377/64, 75

(56) References Cited

U.S. PATENT DOCUMENTS 5,777,906 A * 7/1998 Lau et al. ................... 708/209
6,381,295 B1 * 4/2002 Lin ............................. 377/69

* cited by examiner

Primary Examiner—Margaret R. Wambach
(74) Attorney, Agent, or Firm—Robert D. Marshall, Jr.; W. James Brady, III; Frederick J. Telecky, Jr.

(57) ABSTRACT

This invention describes a unique high-speed implementation for overflow detection logic to be used in high performance shifter functions. The overflow logic makes use of parallelism in combining shift value decoding and mask generation logic with the logic necessary to propagate data. Designs for both 16-bit and 32-bit shifters are presented and performance improvement of the new designs over conventional overflow detection circuits is demonstrated.

7 Claims, 7 Drawing Sheets

HIGH SPEED AND COMPACT OVERFLOW DETECTION FOR SHIFTERS

TECHNICAL FIELD OF THE INVENTION

The technical field of this invention is overflow detection for shifter circuits used in data processing.

BACKGROUND OF THE INVENTION

Detection of overflow when shifting data in an arithmetic logic unit (ALU) requires logic with significant propagation delay. Often overflow detection takes more time than the shift operation that generates the overflow. The conventional algorithm for overflow detection performs mask generation and data propagation serially or sequentially. This algorithm may be described as follows. First a shift mask is generated from the binary value of the desired impending shift.

Table 1 shows an example of the shift mask generation for 16-bit shifter. The mask has five leading bits '1', ten following bits '0' and a least significant bit that is a don't care (X).

TABLE 1

| Shift value | 0101 |
|---|---|
| Mask | 1111 1000 0000 000X |

In the next step the mask is used to filter the data with AND gates as follows. The least significant bit of the data is ignored because it will never be shifted out by shift operation. Table 2 shows 16-bit filtering for the example shift value of 5 (binary 0101).

TABLE 2

| Data | 0010 1001 1110 0011 |
|---|---|
| Shifted Data | 0011 1100 011X XXXX |
| Mask | 1111 1000 0000 000X |
| Result | 0010 1000 0000 000X |

The resulting bit sequence contains '1' bits if the shift would cause an overflow. The propagation circuit detects occurrence of '1' bits by taking a logical OR of each bit in the sequence, and '1' appears at the overflow output OVF when overflow occurs.

This conventional algorithm takes significant time to execute because data propagation for the OR operation starts ration and masking operation complete. The truth table for 16-Bit overflow detection is given in Table 3. The complexity of a conventional 16-bit overflow detector function is not extraordinary and the truth table may be satisfied with a straightforward logic design.

TABLE 3

| Shift Value | LSB Data = '1' Causing Overflow with Shift | Masked Bits | S0 | S1 | S2 | S3 |
|---|---|---|---|---|---|---|
| 15 | D1 | D15-D1 | 1 | 1 | 1 | 1 |
| 14 | D2 | D15-D2 | 0 | 1 | 1 | 1 |
| 13 | D3 | D15-D3 | 1 | 0 | 1 | 1 |
| 12 | D4 | D15-D4 | 0 | 0 | 1 | 1 |
| 11 | D5 | D15-D5 | 1 | 1 | 0 | 1 |
| 10 | D6 | D15-D6 | 0 | 1 | 0 | 1 |
| 9 | D7 | D15-D7 | 1 | 0 | 0 | 1 |
| 8 | D8 | D15-D8 | 0 | 0 | 0 | 1 |
| 7 | D9 | D15-D9 | 1 | 1 | 1 | 0 |
| 6 | D10 | D15-D10 | 0 | 1 | 1 | 0 |
| 5 | D11 | D15-D11 | 1 | 0 | 1 | 0 |

TABLE 3-continued

| Shift Value | LSB Data = '1' Causing Overflow with Shift | Masked Bits | S0 | S1 | S2 | S3 |
|---|---|---|---|---|---|---|
| 4 | D12 | D15-D12 | 0 | 0 | 1 | 0 |
| 3 | D13 | D15-D13 | 1 | 1 | 0 | 0 |
| 2 | D14 | D15-D14 | 0 | 1 | 0 | 0 |
| 1 | D15 | D15 | 1 | 0 | 0 | 0 |

FIG. 1 illustrates a conventional overflow detection circuit for a 16-bit shifter. The circuit consists of three parts: a mask decoder generator at levels 101, 102, and 103; masking levels 104 and 105; and a propagation stage in levels 106 through 108. Shift value 100 is the number of bit positions the data is to be shifted during the impending shift in binary. The mask decoder generator at levels 101, 102 and 103 decodes the value into a series of binary digits called the shift mask S. When the shift value S is N, the shift mask consists of N bits of '1's and M-N-1 bits of. '0's, where M is bit-length of the data. In the example illustrated above, with shift value binary '0101' (or decimal 5), the leading five bits D11 through D15 mark bit positions in which a '1' in the data produces an overflow. Mask generation is performed in logic levels 101 through 103. The 15-bit shift mask appears at the output of logic level 103. Recall that the least significant bit cannot generate an overflow. Then, a cluster of AND gates performs the masking operation driving outputs at level 104. The logic masks these bit positions in logic levels 101 through 103. Data information enters at level 104 and the resulting bit sequence from the masking operation enters at level 105. The remaining logic levels 106, 107, and 108 form an OR-tree to compute the presence of a data value of '1' within the masked field producing an overflow.

FIGS. 2A and 2B illustrate a conventional 32-bit overflow detector. FIG. 2A is the first portion and FIG. 2B the second portion of the logic. First note that several packets of signals form the interconnect between the two figures. Signal packet 201 passes the five shift bits S0 through S4 between the two drawings. Signal packet 202 passes several intermediate signals generated in FIG. 2B to inputs of logic in FIG. 2. Signal packet 203 passes the sixteen most significant data bits D31:D16 from FIG. 2A to FIG. 2B. Finally, two inputs 206 and 207 to OVF output gate 208 of FIG. 2A come from log-c generating these signals in FIG. 2B.

Table 4 shows the truth table for the 32-bit overflow detector function for shifters. This table can be applied directly to generation of the logic of FIGS. 2A and 2B which are most similar in organization to that of the conventional 16-Bit shifter overflow detector function of FIG. 1. It: is worthwhile to point out that in the design of many high speed logic functions optimal propagation delay performance dictates that each gate have a relatively small number of inputs. Often it is desirable to use cascaded two input gates in preference to less levels of gates having a large number of inputs (e.g. 8-input gates). Also it is sometimes preferable to use cascaded NAND gates to implement the logical equivalent of and AND-OR function for example. The cascaded NAND function appears in several parts of the logic of FIGS. 2A and 2B. One example is noted with NAND gates 211, 212, and 213 cascaded with NAND gate 205. Notice that in both the conventional 16-bit overflow function of FIG. 1 and the conventional 32-bit shifter of FIGS. 2A and 2B, decoding of the shift value precedes the input of data in the logic path. Levels 101, 102 perform the shift decoding in FIG. 1. Levels 201 and 202 perform shift value decoding in FIGS. 2A and 2B.

TABLE 4

| Shift Value | LSB Data = '1' Causing Overflow with Shift | Masked Bits | S0 | S1 | S2 | S3 | S4 |
|---|---|---|---|---|---|---|---|
| 31 | D1 | D31-D1 | 1 | 1 | 1 | 1 | 1 |
| 30 | D2 | D31-D2 | 0 | 1 | 1 | 1 | 1 |
| 29 | D3 | D31-D3 | 1 | 0 | 1 | 1 | 1 |
| 28 | D4 | D31-D4 | 0 | 0 | 1 | 1 | 1 |
| 27 | D5 | D31-D5 | 1 | 1 | 0 | 1 | 1 |
| 26 | D6 | D31-D6 | 0 | 1 | 0 | 1 | 1 |
| 25 | D7 | D31-D7 | 1 | 0 | 0 | 1 | 1 |
| 24 | D8 | D31-D8 | 0 | 0 | 0 | 1 | 1 |
| 23 | D9 | D31-D9 | 1 | 1 | 1 | 0 | 1 |
| 22 | D10 | D31-D10 | 0 | 1 | 1 | 0 | 1 |
| 21 | D11 | D31-D11 | 1 | 0 | 1 | 0 | 1 |
| 20 | D12 | D31-D12 | 0 | 0 | 1 | 0 | 1 |
| 19 | D13 | D31-D13 | 1 | 1 | 0 | 0 | 1 |
| 18 | D14 | D31-D14 | 0 | 1 | 0 | 0 | 1 |
| 17 | D15 | D31-D15 | 1 | 0 | 0 | 0 | 1 |
| 16 | D16 | D31-D16 | 0 | 0 | 0 | 0 | 1 |
| 15 | D17 | D31-D17 | 1 | 1 | 1 | 1 | 0 |
| 14 | D18 | D31-D18 | 0 | 1 | 1 | 1 | 0 |
| 13 | D19 | D31-D19 | 1 | 0 | 1 | 1 | 0 |
| 12 | D20 | D31-D20 | 0 | 0 | 1 | 1 | 0 |
| 11 | D21 | D31-D21 | 1 | 1 | 0 | 1 | 0 |
| 10 | D22 | D31-D22 | 0 | 1 | 0 | 1 | 0 |
| 9 | D23 | D31-D23 | 1 | 0 | 0 | 1 | 0 |
| 8 | D24 | D31-D24 | 0 | 0 | 0 | 1 | 0 |
| 7 | D25 | D31-D25 | 1 | 1 | 1 | 0 | 0 |
| 6 | D26 | D31-D26 | 0 | 1 | 1 | 0 | 0 |
| 5 | D27 | D31-D27 | 1 | 0 | 1 | 0 | 0 |
| 4 | D28 | D31-D28 | 0 | 0 | 1 | 0 | 0 |
| 3 | D29 | D31-D29 | 1 | 1 | 0 | 0 | 0 |
| 2 | D30 | D31-D30 | 0 | 1 | 0 | 0 | 0 |
| 1 | D31 | D31 | 1 | 0 | 0 | 0 | 0 |

SUMMARY OF THE INVENTION

This invention describes a unique high-speed implementation for overflow detection logic to be used in high performance shifter functions. The overflow logic makes use of parallelism in combining shift value decoding and mask generation logic with the logic necessary to propagate data. Designs for both 16-bit and 32-bit shifters are presented and performance improvement of the new designs over conventional overflow detection circuits is demonstrated.

BRIEF DESCRIPTION OF THE DRAWINGS

These and other aspects of this invention are illustrated in the drawings, in which.

DETAILED DESCRIPTION OF PREFERRED EMBODIMENTS

In the shift overflow detection circuits of this invention the masking operation is performed in parallel with logical OR operations on the data. This reduces the number of delay levels in the critical path and the total propagation delay time of the circuit. The number of circuit elements is reduced as well, resulting in less power consumption of the circuit.

Figure 3:
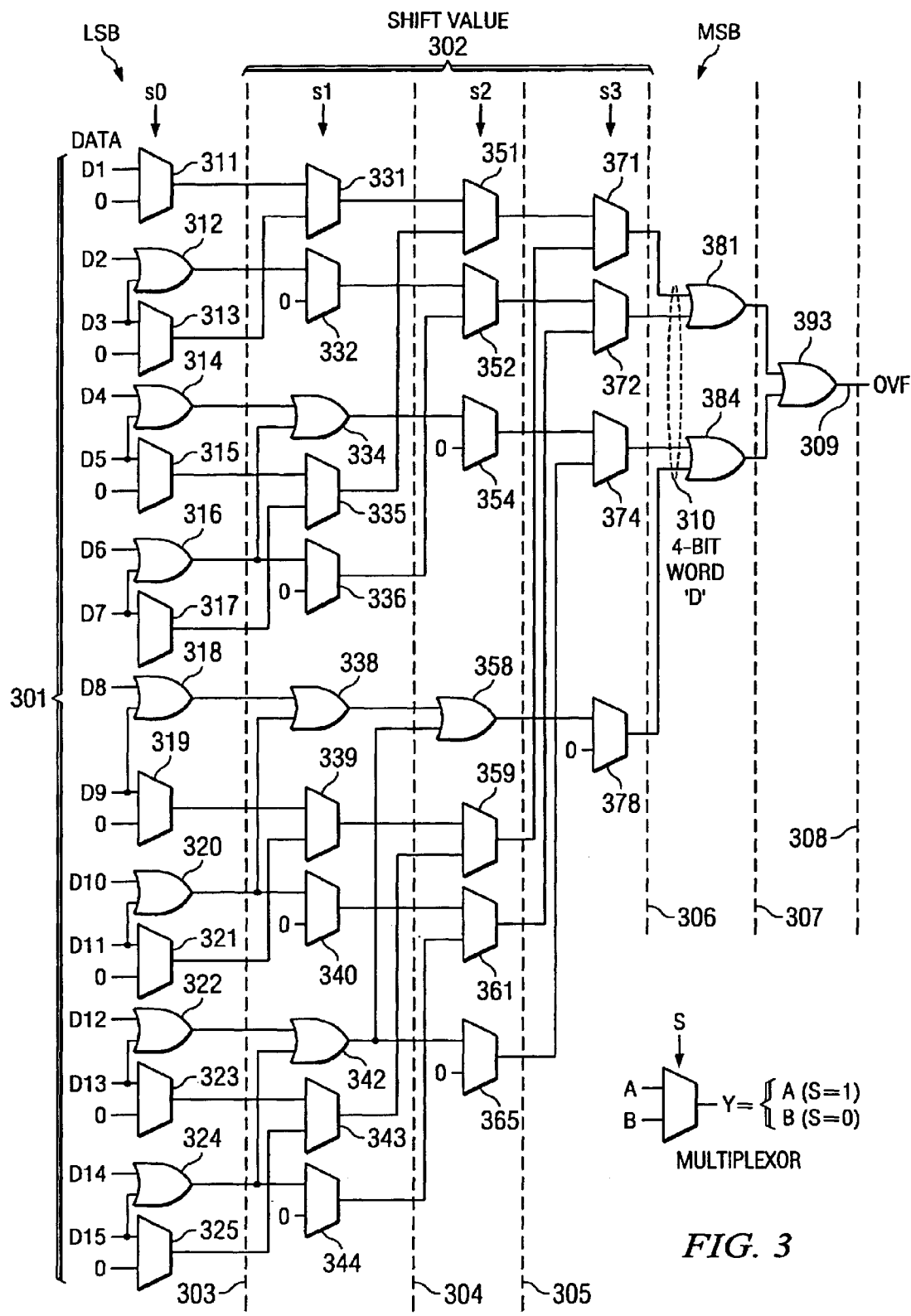
FIG. 3 illustrates the overflow detection circuit for 16-bit shifter according to this invention.

FIG. 3 illustrates a detection circuit for 16-bit shifter constructed by this new circuit concept. The circuit consists entirely of OR gates (312, 314, 316, 318, 329, 322, 324, 334, 338, 342, 358, 381, 384 and 393) and multiplexers (311, 313, 315, 317, 319, 321, 323, 325, 331, 332, 335, 336, 339, 340, 343, 344, 351, 352, 354, 359, 361, 365, 371, 372, 374, 378). All multiplexers have one control line each driven from one of the shift value lines 302. Multiplexers aligned prior to level 303 have select input S0. Multiplexers aligned prior to level 304 have select input S1. Level 305 select input is S2; level 306 select input is S3. Data propagation and data masking are executed simultaneously. In parallel with the data propagation by the OR gates, the multiplexers perform the masking operation following the shift values as illustrated in FIG. 3. The 16 bit data 301 is combined according to the truth table of Table 1 at levels 303, 304, 305 and 306. These 4-stage paths of 2-input OR gates and 2:1 multiplexers form a tree in which the 16-bit data is compressed into a 4-bit word D 310 at level 306. The four bits of D are combined in two 2-bit OR gates 381 and 384 with two outputs at level 307. A final OR gate 393 at level 30E reduces these two to the output overflow signal OVF 309 which is high if an overflow has been detected.

The OR gates and multiplexers are arranged and connected following the four construction rules below. The following description uses these definitions: M is the bit-length of the data; N is the bit length of shift value; ELEM(i,d) is the circuit element placed at d-th bit of i-th stage; OUT(i,d) is the output of ELEM(i,d); OR(A,B) represents an OR gate with signals A and B as inputs; MUX (A,B,i) represents a multiplexer that propagates signal A when the i-th bit of the shift value is 1 and propagates B when i-th bit of the shift value is 0.

Rule 1: If $d=2^{n}*29^{i}$ and n is in the range $1 \leq n \leq ((M/2^{i+1})-1)$, then ELEM(i,d)=OR(OUT(i-1, d+$2^i$), OUT(i—1,d)).

Rule 2: If $d=2^{n}*2^{i}+2^{j}$, n is in the range $1 \geq n \geq ((M/2^{i+1})-1)$ and j is in the range $0 \geq j \geq i+1$, then ELEM(i,d)=MUX (OUT(i+1,d), OUT(i-1,d+$2^i$), i).

Rule 3: If $d=(2^{n}+1)*2^{i}$, n is in the range $1 \leq n \leq ((M/2^{i+1})+1)$ and j is in the range $0 \geq j \geq i+1$, then ELEM(i,d)=MUX (OUT(i+1,d), 0, i).

Rule 4: For all other combinations of i and d, no element at location ELEM(i,d).

Figure 1:
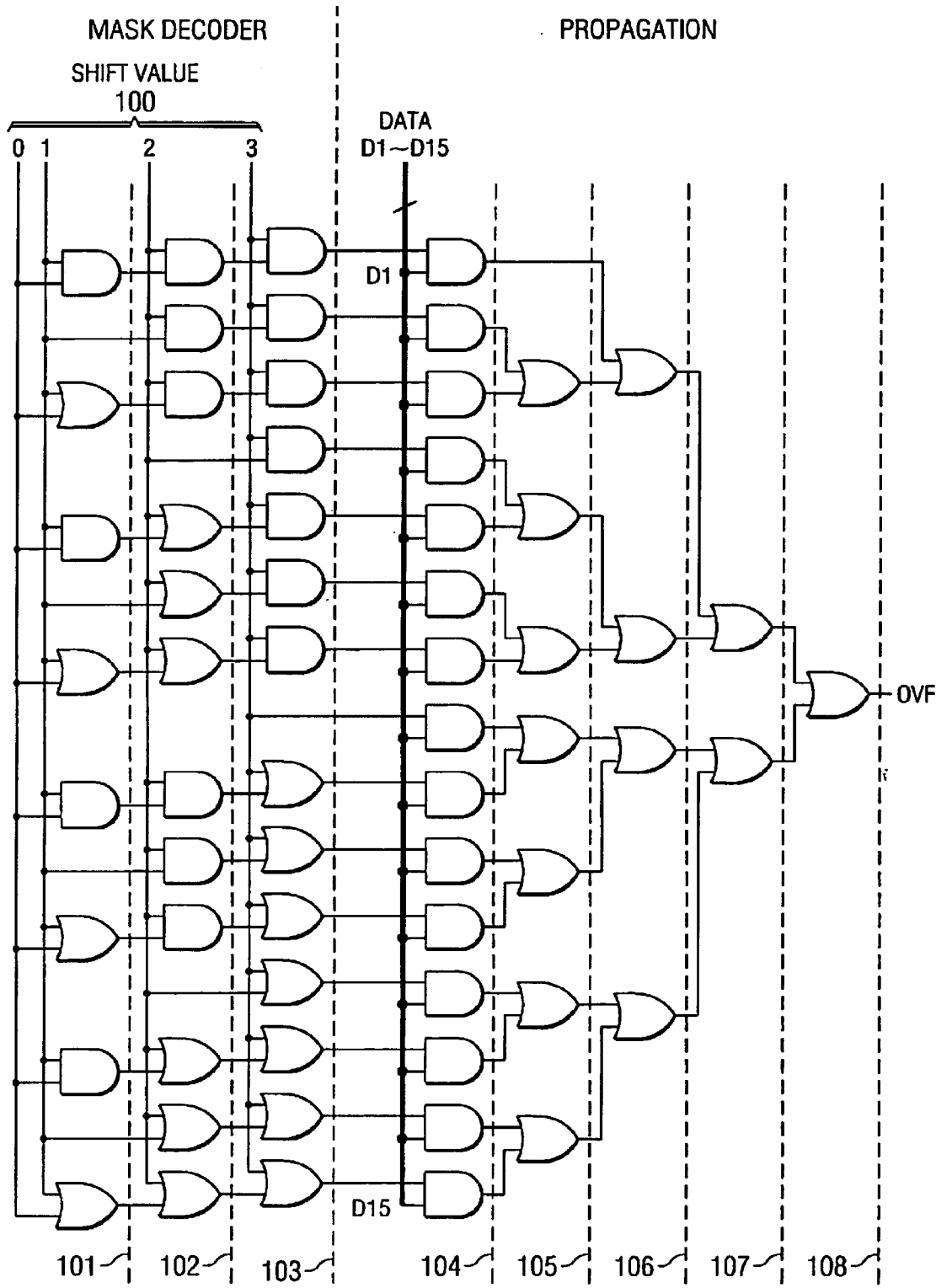
FIG. 1 illustrates a conventional overflow detection circuit for a 16-bit shifter (Prior Art)

The number of stages in this circuit is smaller than the number in a conventional circuit. Assume that N is the maximum bit-length of shift value and that M ($=2^N$) is the bit-length of data to be shifted. Assume the circuit includes only one and two input logic gates. The conventional circuit requires at least $\log_2(N)$ stages to construct mask generation circuit. The circuit also requires one stage of NAND gates for data masking. The propagation circuit requires $\log_2(M)=N$ stages of NOR tree. Consequently, the conventional circuit requires $N+\log_2(N)+1$ gates to detect overflow. On the other hand, in the detection circuit of this invention the multiplexer tree needs only N stages. The logical OR of the multiplexed signals requires an additional $\log_2(N)$ stages. Thus, this circuit of this invention requires $N+\log_2(N)$ gates. Thus the circuit of this invention can always be constructed with at least one less gate stage than the conventional circuit. The conventional 16-bit circuit illustrated in FIG. 1 requires 63 circuit elements, while the inventive circuit illustrated in FIG. 3 requires only 40. This reduction number of circuit elements will result in reduction of area of the circuit block and also in reduction of operational power.

Figure 4A:
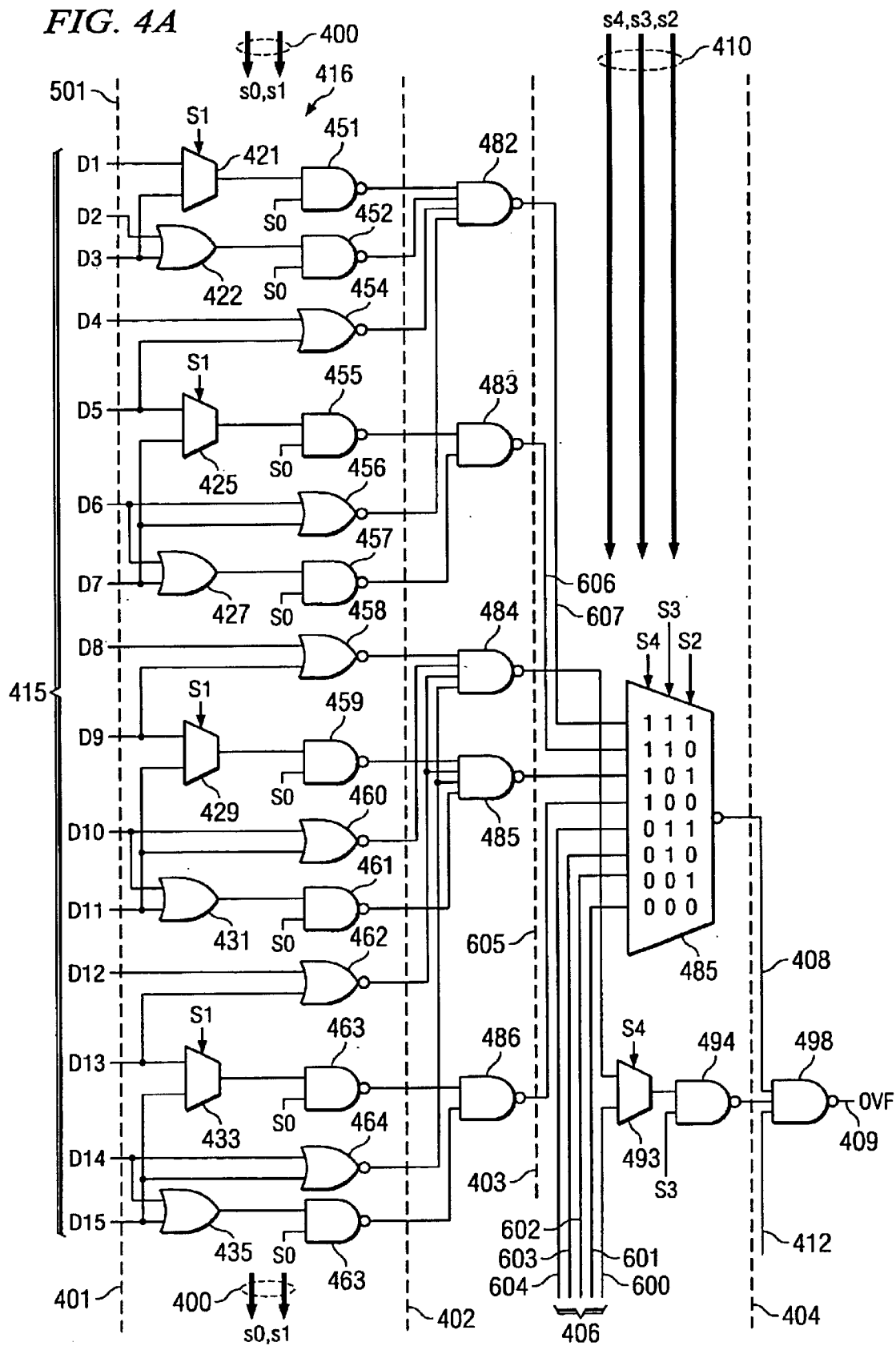
FIG. 4A illustrates the first portion (bits 0 through 1' and output portion) of the 32-bit shifter overflow detection circuit according to this invention.
Figure 4B:
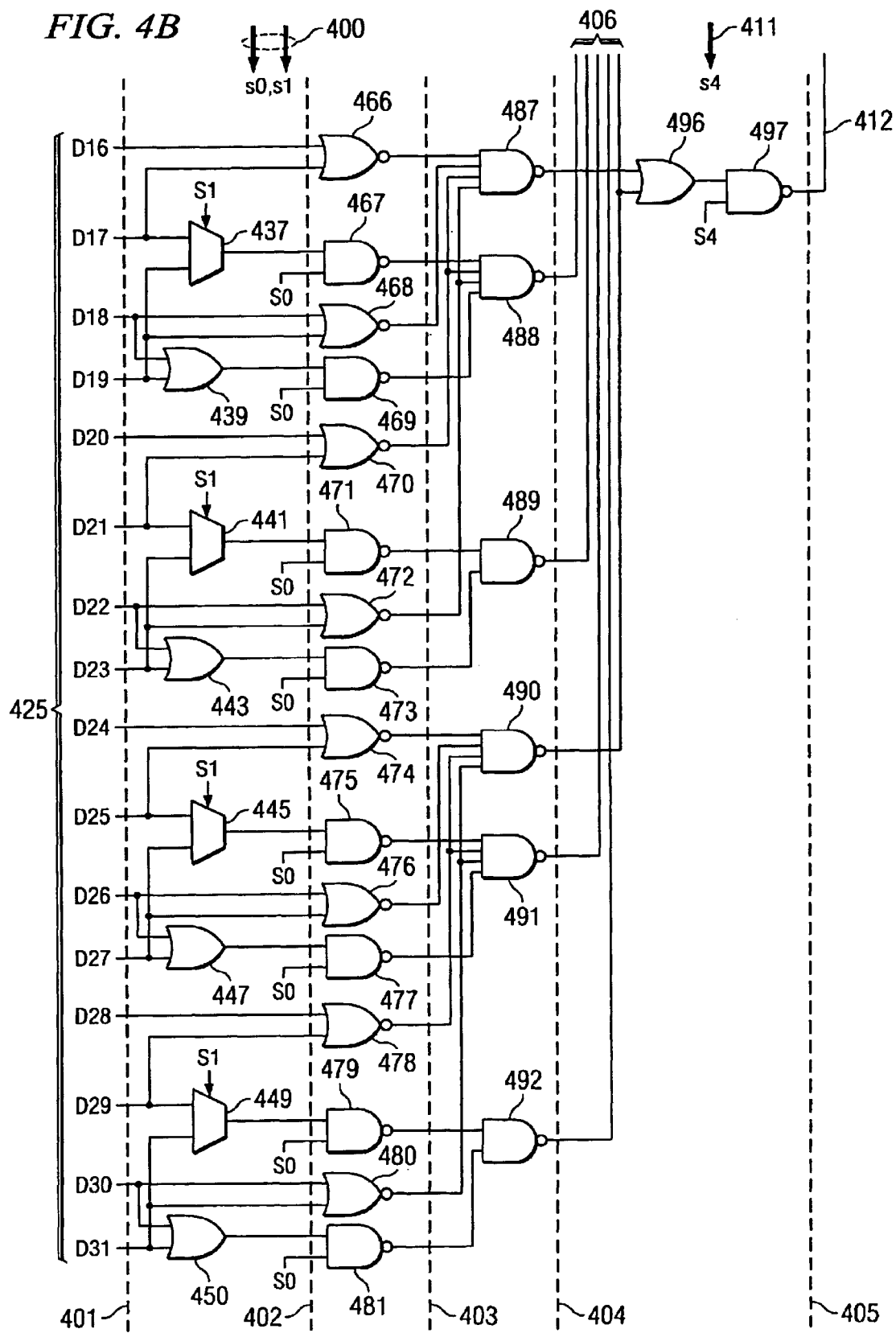
FIG. 4B illustrates the second portion (bits 16 through 31) of the 32-bit shifter overflow detection circuit according to this invention.

To illustrate the extension of the algorithm given in the four rules above, a 32-bit overflow detection circuit was designed and then simplified and reduced keeping the same logic functionality. FIGS. 4A and 4B illustrate the resulting circuit which utilizes 2-input multiplexers (see 421) illustrated in FIG. 5. The 32-bit overflow detection circuit also makes use of a more complex 8-input multiplexer 417 illustrated in FIG. 6.

Referring to FIG. 4A, data inputs 415 to the overflow detection circuit are combined with shift inputs 400 and 410 according to the truth table (Table 4) requirements to generate the overflow signal OVF 409. The 32-bit implementation calls for a large number of wide-OR logic gates that are more efficiently implemented by NAND gates (482, 484, 485, 487, 488, 490, 491) combined with multiplexer stages to form the equivalent OR terms. For purposes of propagation delay analysis, the logic levels are labeled as 401 through 404, three delays in total prior to the output stage OR gate 420. The select signals s0 and s1 are passed to she higher order bits of the circuit FIG. 4B as shown by signals 400 at the lower portion of FIG. 4A. From the three select bits s2, s3, and s4 (signals 410 in FIG. 4A), only s4 is passed through to the higher order bits of the circuit in FIG. 4B (s4 is represented by 411 in FIG. 4B).

Referring to FIG. 4B, the higher order bits have data inputs 425, select inputs 400 and 411 and logic levels 40 through 404 similar to the labeling in FIG. 4A. The higher order bits pass two signal sets back to the lower order portion of the circuit in FIG. 4A. The first set is signal bundle 403 and the second is the signal 412 which forms one of the main contributors to the logic inputs for gate 420 and the output signal OVF 409 of FIG. 4A.

Referring again to FIGS. 4A and 4B, intermediate signals 600 through 607 are generated as inputs to the 8-input multiplexer 417. The use of the 8-input multiplexer 417 at this point in the logic flow is crucial to the high performance of the 32-bit overflow detection circuit. By the nature of detection of overflow in systems having 32 bits and greater, some stages (wide-OR terms in particular) are needed that benefit greatly from the speed improvements achieved by parallelism. This is especially true here as is illustrated in the multiplexer oriented logic as described in FIGS. 5 and 6.

Figure 5:
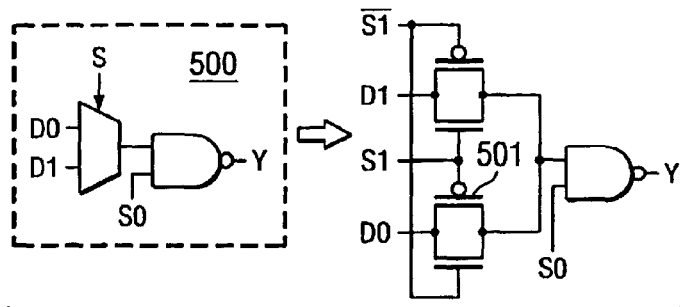
FIG. 5 illustrates the implementation details of the two-to-one multiplexers for the 32-bit shifter overflow detection circuit according to this invention.
Figure 6:
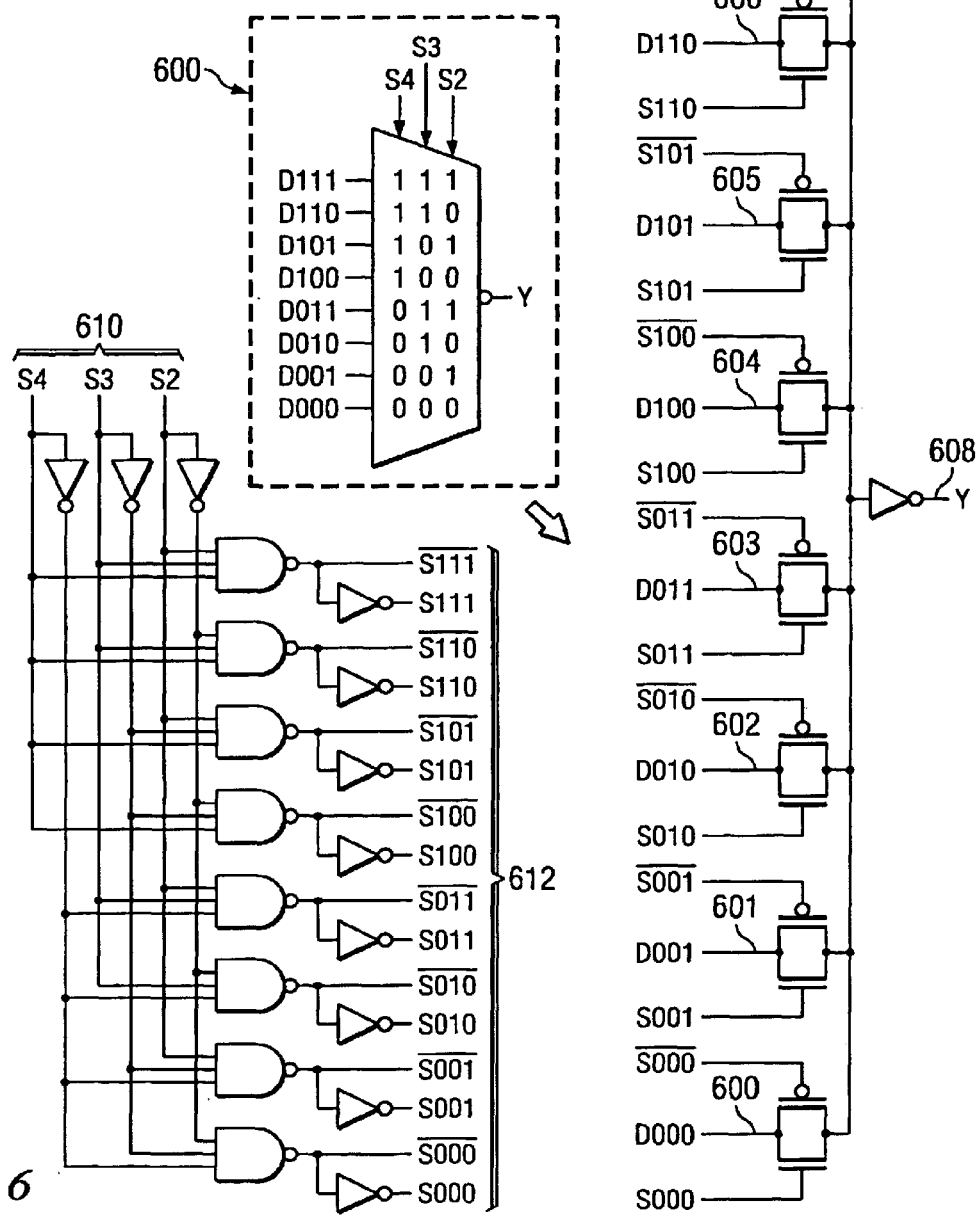
FIG. 6 illustrates the implementation details of the eight-to-one multiplexers for the 32-bit shifter overflow detection circuit according to this invention.

Two multiplexer stages are illustrated in FIGS. 5 and 6. FIG. 5 illustrates the 2-input multiplexer 500 and 501. The multiplexer-NAND implementation of the 2-input multiplexer is illustrated in 500 of FIG. 5. The implementation is taken one step closer to the component level by the circuit 501 of FIG. 5.

FIG. 6 illustrates the 8-input multiplexer 600 broken down into two portions of the implementation. The first portion shows the shift decode portion which decodes shift inputs 610 into decoded shift inputs 612. The second portion is the 8:1 multiplexer. This combines the data inputs 600 through 607 and the decoded shift inputs 612 to form the intermediate output term 608.

Figure 2A:
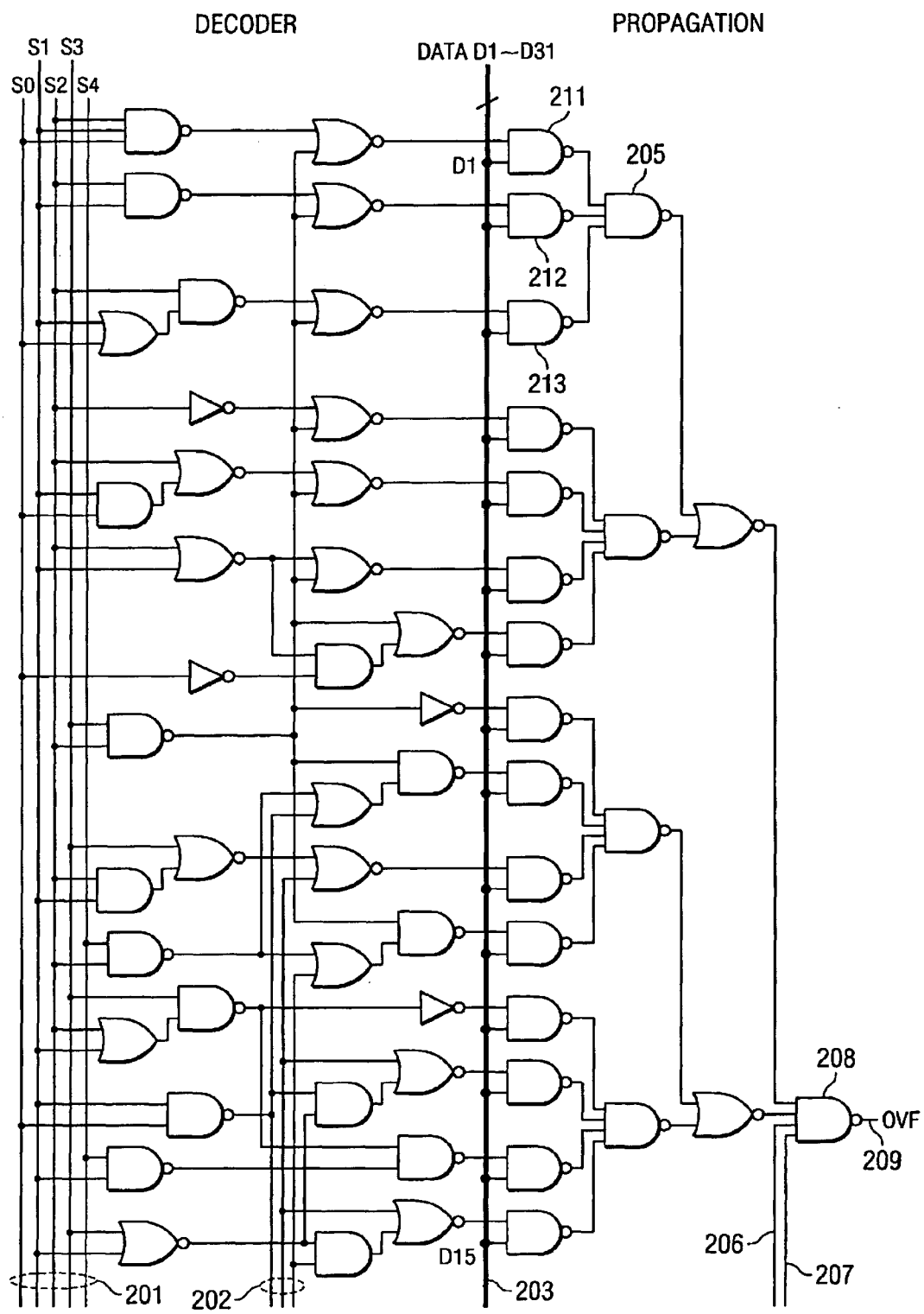
FIG. 2A illustrates the first portion of a conventional overflow detection circuit for a 32-bit shifter (Prior Art)
Figure 2B:
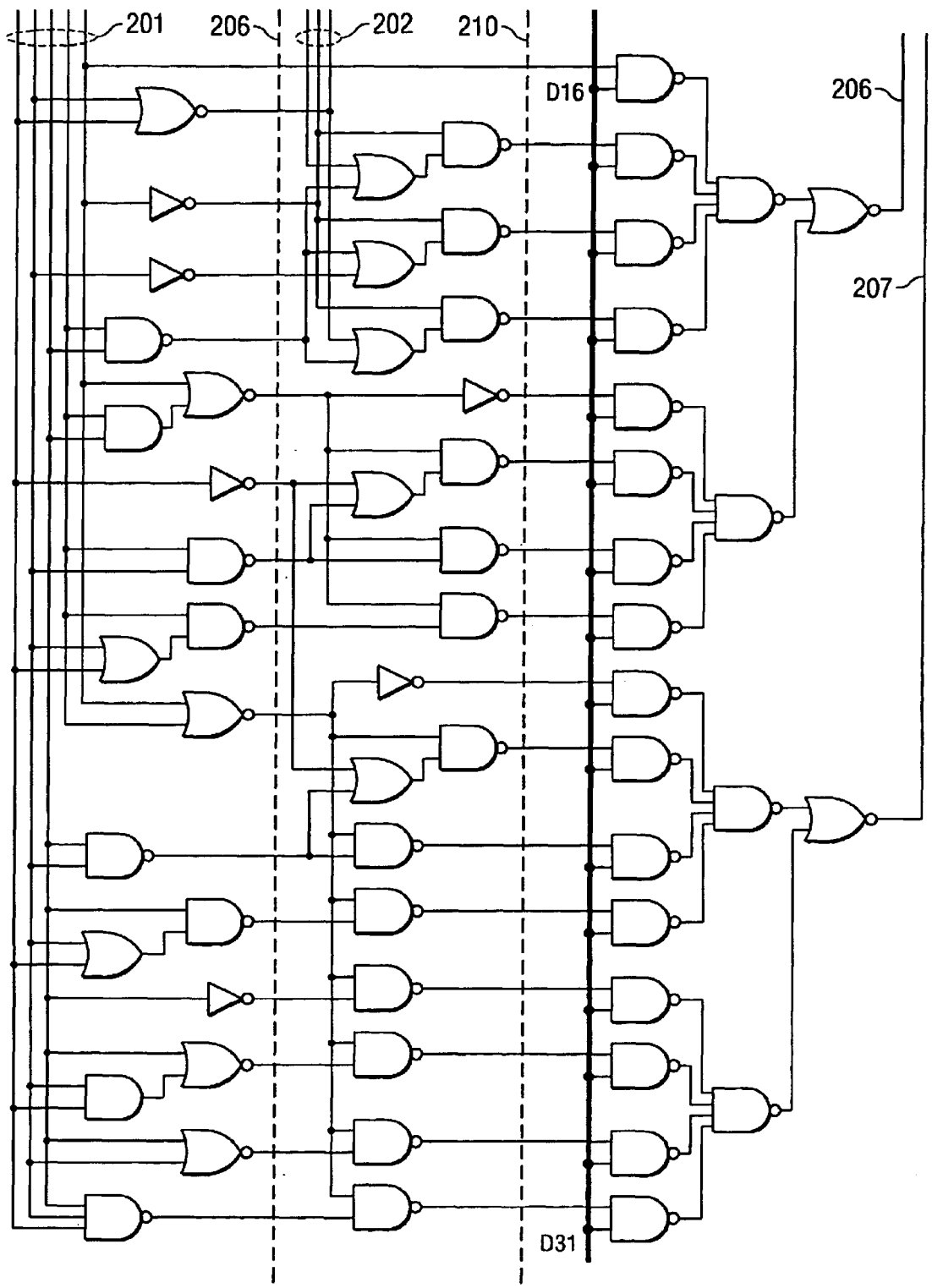
FIG. 2B illustrates the second portion of a conventional overflow detection circuit for a 32-bit shifter (Prior Art)

Table 5 compares the performance of the circuit in FIGS. 4A and 4B with the conventional 32-bit overflow detector circuit illustrated in FIGS. 2A and 2B. Circuit performance of these circuits was simulated using an industry standard static timing analysis tool. Table 5 also compares the power consumption of the two circuits using an industry standard power dissipation analysis tool. The two circuits were designed using the same circuit library and identical models at corresponding logic levels. Analysis condition was 125° C. and a power supply of 1.35 Volts. The comparison results summarized in the table show that the new circuit provides significantly better results compared to the conventional circuit on both propagation delay performance and power dissipation.

TABLE 5

|  | Conventional | Present Invention | Difference |
|---|---|---|---|
| Maximum Delay Path in Gates | 6 | 4 | −33% |
| Maximum Delay Path in nanoSec | 0.750 | 0.629 | 16% |
| Power [mW/MHz] | 0.501 | 0.336 | −33% |

What is claimed is:

1. A shift overflow detection circuit for a shifter having a data bit length of M and a shift control value bit length of N comprising:

a plurality of circuit elements disposed in M rows and N columns, each circuit element(i,d) of the i-th row and the d-th column having two inputs and an output, a circuit element of a last column generating an output of said shift overflow detection circuit, wherein:

if $d=2^n*2^i$ where n is in the range $1 \leq n \leq ((M/2^{i+1})-1)$, then element(i,d) is an OR gate having a first input connected to said output of element(i−1,d+$2^i$) and a second input connected to said output of element(i−1, d), if $d=2^n*2^i+2^j$ where n is in the range $1 \leq n \leq ((M/2^{i+1})-1)$ and j is in the range $0 \leq j \leq i-1$, then element(i,d) is a multiplexer having a first input connected to said output of element(i−1,d), a second input connected to said output of element(i−1,d+$2^i$) and a control input receiving the i-bit of said shift control value, if $d=(2^+1)*2^i$, where n is in the range $1 \leq n \leq ((M/2^{i+1})-1)$ and j is in the range $0 \leq j \leq i-1$, then element (i,d) is a multiplexer having a first input connected to said output of element (i−1,d), a second input receiving 0 and a control input receiving the i-bit of said shift control value, and for all other combinations of i and d, there is no element (i,d).

2. The shift overflow detector of claim 1, wherein:

each multiplexer includes a first pass gate having a input connected to said first input of said multiplexer, an output connected to said output of said multiplexer and receiving said control input in a first polarity whereby said first pass gate is conducting when said control input is 1, and a second pass gate having a input connected to said second input of said multiplexer, an output connected to said output of said multiplexer and receiving said control input in a second polarity opposite to said first polarity whereby said first pass gate is conducting when said control input is 0.

3. A shift overflow detection circuit having a 16 bit data length [D15:D0] and a shift control value of 4 bits [S3:S0], comprising:

a first multiplexer having a first input receiving data bit D1, a second input receiving 0, a control input receiving shift value bit S0 and an output;

a first OR gate having a first input receiving data bit D2, a second input receiving data bit D3 and an output;

a second multiplexer having a first input receiving data bit D3, a second input receiving 0, a control input receiving shift value bit S0 and an output;

a second OR gate having a first input receiving data bit D4, a second input receiving data bit D5 and an output;

a third multiplexer having a first input receiving data bit D5, a second input receiving 0, a control input receiving shift value bit S0 and an output;

a third OR gate having a first input receiving data bit D6, a second input receiving data bit D7 and an output;

a fourth multiplexer having a first input receiving data bit D7, a second input receiving 0, a control input receiving shift value bit S0 and an output;

a fourth OR gate having a first input receiving data bit DB, a second input receiving data bit D9 and an output;

a fifth multiplexer having a first input receiving data bit D9, a second input receiving 0, a control input receiving shift value bit S0 and an output;

a fifth OR gate having a first input receiving data bit blo, a second input receiving data bit D11 and an output;

a sixth multiplexer having a first input receiving data bit D11, a second input receiving 0, a control input receiving shift value bit S0 and an output;

a sixth OR gate having a first input receiving data bit D12, a second input receiving data bit D13 and an output;

a seventh multiplexer having a first input receiving data bit D13, a second input receiving 0, a control input receiving shift value bit S0 and an output;

a seventh OR gate having a first input receiving data bit D14, a second input receiving data bit D15 and an output;

an eighth multiplexer having a first input receiving data bit D15, a second input receiving 0, a control input receiving shift value bit S0 and an output;

a ninth multiplexer having a first input connected to said output of said first multiplexer, a second input connected to said output of said second multiplexer, a control input receiving shift control value bit S1 and an output;

a tenth multiplexer having a first input connected to said output of said first OR gate, a second input receiving 0, a control input receiving shift control value bit S1 and an output;

an eighth OR gate having a first input connected to said output of said second OR gate, a second input connected to said output of said third OR gate and an output;

an eleventh multiplexer having a first input connected to said output of said third multiplexer, a second input connected to said output of said fourth multiplexer, a control input receiving shift control value bit S1 and an output;

a twelfth multiplexer having a first input connected to said output of said third OR gate, a second input receiving 0, a control input receiving shift control value bit S1 and an output;

a ninth OR gate having a first input connected to said output of said fourth OR gate, a second output connected to said output of said fifth OR gate and an output;

a thirteenth multiplexer having a first input connected to said output of said fifth multiplexer, a second input connected to said output of said sixth multiplexer, a control input receiving shift control value bit S1 and an output;

a fourteenth multiplexer having a first input connected to said output of said fifth OR gate, a second input receiving 0, a control input receiving shift control value bit S1 and an output;

a tenth OR gate having a first input connected to said output of said sixth OR gate, a second output connected to said output of said seventh OR gate and an output;

a fifteenth multiplexer having a first input connected to said output of said seventh multiplexer, a second input connected to said output of said eighth multiplexer, a control input receiving shift control value bit S1 and an output;

a sixteenth multiplexer having a first input connected to said output of said seventh OR gate, a second input receiving 0, a control input receiving shift control value bit S1 and an output;

a seventeenth multiplexer having a first input connected to said output of said ninth multiplexer, a second input connected to said output of said eleventh multiplexer, a control input receiving shift control value bit S2 and an output;

an eighteenth multiplexer having a first input connected to said output of said tenth multiplexer, a second input connected to said output of said twelfth multiplexer, a control input receiving shift control value bit S2 and an output;

a nineteenth multiplexer having a first input connected to said output of said eighth OR gate, a second input receiving 0, a control input receiving shift control value bit S2 and an output;

an eleventh OR gate having a first input connected to said output of said ninth OR gate, a second output connected to said output of said tenth OR gate and an output;

a twentieth multiplexer having a first input connected to said output of said thirteenth multiplexer, a second input connected to said output of said fifteenth multiplexer, a control input receiving shift control value bit S2 and an output;

a twenty first multiplexer having a first input connected to said output of said fourteenth multiplexer, a second input connected to said output of said sixteenth multiplexer, a control input receiving shift control value bit S2 and an output;

a twenty second multiplexer having a first input connected to said output of said tenth OR gate, a second input receiving 0, a control input receiving shift control value bit S2 and an output;

a twenty third multiplexer having a first input connected to said output of said seventeenth multiplexer, a second input connected to said output of said twentieth multiplexer, a control input receiving shift control value bit S3 and an output;

a twenty fourth multiplexer having a first input connected to said output of said eighteenth multiplexer, a second input connected to said output of said twenty first multiplexer, a control input receiving shift control value bit S3 and an output;

a twenty fifth multiplexer having a first input connected to said output of said nineteenth multiplexer, a second input connected to said output of said twenty second multiplexer, a control input receiving shift control value bit S3 and an output;

a twenty sixth multiplexer having a first input connected to said output of said eleventh OR gate, a second input receiving 0, a control input receiving shift control value bit S3 and an output;

a twelfth OR gate having a first input connected to said output of said twenty third multiplexer, a second input connected to said output of said twenty fourth multiplexer and an output;

a thirteenth OR gate having a first input connected to said output of said twenty fifth multiplexer, a second input connected to said output of said twenty sixth multiplexer and an output; and a fourteenth OR gate having a first input connected to said output of said twelfth OR gate, a second input connected to said output of said thirteenth OR gate and an output forming an output of said shift overflow detection circuit.

4. The shift overflow detector of claim 2, wherein:

each of said first multiplexer, said second multiplexer, said third multiplexer, said fourth multiplexer, said fifth multiplexer, said sixth multiplexer, said seventh multiplexer, said eighth multiplexer, said ninth multiplexer, said tenth multiplexer, said eleventh multiplexer, said twelfth multiplexer, said thirteenth multiplexer, said fourteenth multiplexer, said fifteenth multiplexer, said sixteenth multiplexer, said seventh multiplexer, said eighteenth multiplexer, said nineteenth multiplexer, said twentieth multiplexer, said twenty first multiplexer, said twenty second multiplexer, said twenty third multiplexer, said twenty fourth multiplexer, said twenty fifth multiplexer and said twenty sixth multiplexer includes a first pass gate having a input connected to said first input of said multiplexer, an output connected to said output of said multiplexer and receiving said control input in a first polarity whereby said first pass gate is conducting when said control input is 1, and a second pass gate having a input connected to said second input of said multiplexer, an output connected to said output of said multiplexer and receiving said control input in a second polarity opposite to said first polarity whereby said first pass gate is conducting when said control input is 05.

5. A shift overflow detection circuit having a 32 bit data length [D31:D0] and a shift control value of 5 bits [S4:S0], comprising:

a first multiplexer having a first input receiving data bit D1, a second input receiving data bit D3, a control input receiving shift control value bit S1 and an output;

a first NAND gate having a first input connected to said output of said first multiplexer, a second input receiving shift control value bit S0 and an output;

a first OR gate having a first input receiving data bit D2, a second input receiving data bit D3 and an output;

a second NAND gate having a first input connected to said output of said first OR gate, a second input receiving shift control value bit S0 and an output;

a first NOR gate having a first input receiving data bit D4, a second input receiving data bit D5 and an output;

a second multiplexer having a first input receiving data bit D5, a second input receiving data bit D7, a control input receiving shift control value bit S1 and an output;

a third NAND gate having a first input connected to said output of said second multiplexer, a second input receiving shift control value bit S0 and an output;

a second NOR gate having a first input receiving data bit D6, a second input receiving data bit D7 and an output;

a second OR gate having a first input receiving data bit D6, a second input receiving data bit D7 and an output;

a fourth NAND gate having a first input connected to said output of said second OR gate, a second input receiving shift control value bit S0 and an output;

a third NOR gate having a first input receiving data bit D8, a second input receiving data bit D9 and an output;

a third multiplexer having a first input receiving data bit D9, a second input receiving data bit D11, a control input receiving shift control value bit S1 and an output;

a fifth NAND gate having a first input connected to said output of said third multiplexer, a second input receiving shift control value bit S0 and an output;

a fourth NOR gate having a first input receiving data bit D10, a second input receiving data bit D11 and an output;

a third OR gate having a first input receiving data bit D10, a second input receiving data bit D11 and an output;

a sixth NAND gate having a first input connected to said output of said third OR gate, a second input receiving shift control value bit S0 and an output;

a fifth NOR gate having a first input receiving data bit D12, a second input receiving data bit D13 and an output;

a fourth multiplexer having a first input receiving data bit D13, a second input receiving data bit D15, a control input receiving shift control value bit S1 and an output;

a seventh NAND gate having a first input connected to said output of said fourth multiplexer, a second input receiving shift control value bit S0 and an output;

a sixth NOR gate having a first input receiving data bit D14, a second input receiving data bit D15 and an output;

a fourth OR gate having a first input receiving data bit D14, a second input receiving data bit D15 and an output;

an eighth NAND gate having a first input connected to said output of said fourth OR gate, a second input receiving shift control value bit S0 and an output;

a seventh NOR gate having a first input receiving data bit D16, a second input receiving data bit D17 and an output;

a fifth multiplexer having a first input receiving data bit D17, a second input receiving data bit D19, a control input receiving shift control value bit S1 and an output;

a ninth NAND gate having a first input connected to said output of said fifth multiplexer, a second input receiving shift control value bit S0 and an output;

an eighth NOR gate having a first input receiving data bit D1, a second input receiving data bit D19 and an output;

a fifth OR gate having a first input receiving data bit D18, a second input receiving data bit D19 and an output;

a tenth NAND gate having a first input connected to said output of said fifth OR gate, a second input receiving shift control value bit S0 and an output;

a ninth NOR gate having a first input receiving data bit D20, a second input receiving data bit D21 and an output;

a sixth multiplexer having a first input receiving data bit D21, a second input receiving data bit D23, a control input receiving shift control value bit S1 and an output;

an eleventh NAND gate having a first input connected to said output of said sixth multiplexer, a second input receiving shift control value bit S0 and an output;

a tenth NOR gate having a first input receiving data bit D22, a second input receiving data bit D23 and an output;

a sixth OR gate having a first input receiving data bit D22, a second input receiving data bit D23 and an output;

a twelfth NAND gate having a first input connected to said output of said sixth OR gate, a second input receiving shift control value bit S0 and an output;

an eleventh NOR gate having a first input receiving data bit D24, a second input receiving data bit D25 and an output;

a seventh multiplexer having a first input receiving data bit D25, a second input receiving data bit D27, a control input receiving shift control value bit S1 and an output;

a thirteenth NAND gate having a first input connected to said output of said seventh multiplexer, a second input receiving shift control value bit S0 and an output;

a twelfth NOR gate having a first input receiving data bit D26, a second input receiving data bit D27 and an output;

a seventh OR gate having a first input receiving data bit D26, a second input receiving data bit D27 and an output;

a fourteenth NAND gate having a first input connected to said output of said seventh OR gate, a second input receiving shift control value bit S0 and an output;

a thirteenth NOR gate having a first input receiving data bit D28, a second input receiving data bit D29 and an output;

an eighth multiplexer having a first input receiving data bit D29, a second input receiving data bit D31, a control input receiving shift control value bit S1 and an output;

a fifteenth NAND gate having a first input connected to said output of said eighth multiplexer, a second input receiving shift control value bit S0 and an output;

a fourteenth NOR gate having a first input receiving data bit D30 a second input receiving data bit D31 and an output;

an eighth OR gate having a first input receiving data bit D30, a second input receiving data bit D31 and an output;

a sixteenth NAND gate having a first input connected to said output of said eighth OR gate, a second input receiving shift control value bit S0 and an output;

a seventeenth NAND gate having a first input connected to said output of said first NAND gate, a second input connected to said output of said second NAND gate, a third input connected to said output of said first NOR gate, a fourth input connected to said output of said second NOR gate and an output;

an eighteenth NAND gate having a first input connected to said output of said third NAND gate, a second input connected to said output of said fourth NAND gate and an output;

a nineteenth NAND gate having a first input connected to said output of said third NOR gate, a second input connected to said output of said fourth NOR gate, a third input connected to said output of said fifth NOR gate, a fourth input connected to said output of said sixth NOR gate and an output;

a twentieth NAND gate having a first input connected to said output of said fifth NAND gate, a second input connected to said output of said sixth NAND gate, a third input connected to said output of said fifth NOR gate, a fourth input connected to said output of said sixth NOR gate and an output;

a twenty first NAND gate having a first input connected to said output of said seventh NAND gate, a second input connected to said output of said eighth NAND gate and an output;

a twenty second NAND gate having a first input connected to said output of said seventh NOR gate, a second input connected to said output of said eighth NOR gate, a third input connected to said output of said ninth NOR gate, a fourth input connected to said output of said tenth NOR gate and an output;

a twenty third NAND gate having a first input connected to said output of said ninth NAND gate, a second input connected to said output of said tenth NAND gate, a third input connected to said output of said ninth NOR gate, a fourth input connected to said output of said tenth NOR gate and an output;

a twenty fourth NAND gate having a first input connected to said output of said eleventh NAND gate, a second input connected to said output of said twelfth NAND gate and an output;

a twenty fifth NAND gate having a first input connected to said output of said eleventh NOR gate, a second input connected to said output of said twelfth NOR gate, a third input connected to said output of said thirteenth NOR gate, a fourth input connected to said output of said fourteenth NOR gate and an output;

a twenty sixth NAND gate having a first input connected to said output of said thirteenth NAND gate, a second input connected to said output of said fourteenth NAND gate, a third input connected to said output of said thirteenth NOR gate, a fourth input connected to said output of said fourteenth NOR gate and an output;

a twenty seventh NAND gate having a first input connected to said output of said fifteenth NAND gate, a second input connected to said output of said sixteenth NAND gate and an output;

a seventeenth multiplexer having a first input connected to said output of said nineteenth NAND gate, a second input connected to said twenty fifth NAND gate, a control input receiving shift control value bit S4 and an output;

a twenty eighth NAND gate having a first input connected to said output of said seventeenth multiplexer, a second input receiving shift control value bit S3 and an output;

a ninth OR gate having a first input connected to said output of said twenty second NAND gate, a second input connected to said output of said twenty fifth NAND gate and an output;

a twenty ninth NAND gate having a first input connected to said output of said ninth OR gate, a second input receiving shift control value bit S4 and an output;

an inverting multiplexer having a first input connected to said output of said seventeenth NAND gate, a second input connected to said output of said eighteenth NAND gate, a third input connected to said output of said twentieth NAND gate, a fourth input connected to said output of said twenty first NAND gate, a fifth input connected to said output of said twenty third NAND gate, a sixth input connected to said output of said twenty fourth NAND gate, a seventh input connected to said output of said twenty sixth NAND gate, an eighth input connected to said output of said twenty seventh NAND gate, three control inputs receiving respective shift control value bits S4, S3 and S2 and an output, whereby said inverting multiplexer outputs a inverted first input if said shift control bits S4, S3 and S2 are "111", a inverted second input if said shift control bits S4, S3 and S2 are "110", a inverted third input if said shift control bits S4, S3 and S2 are "101", a inverted fourth input if said shift control bits S4, S3 and S2 are "100", a inverted fifth input if said shift control bits S4, S3 and S2 are "011", a inverted sixth input if said shift control bits S4, S3 and S2 are "010", a inverted seventh input if said shift control bits S4, S3 and S2 are "001" and a inverted eighth input if said shift control bits S4, S3 and S2 are "000"; and a thirtieth NAND gate having a first input connected to said output of said inverting multiplexer, a second input connected to said output of said twenty eighth NAND gate, a third input connected to said output of said twenty ninth NAND gate and an output forming an output of said shift overflow detection circuit.

6. The shift overflow detector of claim 5, wherein:
each of said first to seventeenth multiplexer includes
a first pass gate having a input connected to said first input of said multiplexer, an output connected to said output of said multiplexer and receiving said control input in a first polarity whereby said first pass gate is conducting when said control input is 1, and
a second pass gate having a input connected to said second input of said multiplexer, an output connected to said output of said multiplexer and receiving said control input in a second polarity opposite to said first polarity whereby said first pass gate is conducting when said control input is 0.

7. The shift overflow detector of claim 5, wherein:
said inverting multiplexer includes a first inverter having a input receiving shift control value bit S2 and an output,
a second inverter having a input receiving shift control value bit S3 and an output,
a third inverter having a input receiving shift control value bit S4 and an output,
a first NAND gate having a first input receiving shift control value S2, a second input receiving shift control value S3, a third input receiving shift control value S4 and an output,
a second NAND gate having a first input connected to said output of said first inverter, a second input receiving shift control value S3, a third input receiving shift control value S4 and an output,
a third NAND gate having a first input receiving shift control value S2, a second input connected to said output of said second inverter, a third input receiving shift control value S4 and an output,
a fourth NAND gate having a first input connected to said output of said first inverter, a second input connected to said output of said second inverter, a third input receiving shift control value S4 and an output,
a fifth NAND gate having a first input receiving shift control value S2, a second input receiving shift control value S3, a third input connected to said output of said third inverter and an output,
a sixth NAND gate having a first input-connected to said output of said first inverter, a second input receiving shift control value S3, a third input connected to said output of said third inverter and an output,
a seventh NAND gate having a first input receiving shift control value S2, a second input connected to said output of said second inverter, a third input connected to said output of said third inverter and an output,
a eighth NAND gate having a first input connected to said output of said first inverter, a second input connected to said output of said second inverter, a third input connected to said output of said third inverter and an output, a fourth inverter having an input connected to said output of said first NAND gate and an output,
a fifth inverter having an input connected to said output of said second NAND gate and an output,
a sixth inverter having an input connected to said output of said third NAND gate and an output,
a seventh inverter having an input connected to said output of said fourth NAND gate and an output,
a eighth inverter having an input connected to said output of said fifth NAND gate and an output,
a ninth inverter having an input connected to said output of said sixth NAND gate and an output,
a tenth inverter having an input connected to said output of said seventh NAND gate and an output,
a eleventh inverter having an input connected to said output of said eighth NAND gate and an output,
a first pass gate having an input connected to said first input of said inverting multiplexer, a first control input connected to said output of said first NAND gate, a second control input connected to said output of said fourth inverter and an output,
a second pass gate having an input connected to said second input of said inverting multiplexer, a first control input connected to said output of said second NAND gate, a second control input connected to said output of said fifth inverter and an output,
a third pass gate having an input connected to said third input of said inverting multiplexer, a first control input connected to said output of said third NAND gate, a second control input connected to said output of said sixth inverter and an output,
a fourth pass gate having an input connected to said fourth input of said inverting multiplexer, a first control input connected to said output of said fourth NAND gate, a second control input connected to said output of said seventh inverter and an output,
a fifth pass gate having an input connected to said fifth input of said inverting multiplexer, a first control input connected to said output of said fifth NAND gate, a second control input connected to said output of said eighth inverter and an output,
a sixth pass gate having an input connected to said sixth input of said inverting multiplexer, a first control input connected to said output of said sixth NAND gate, a second control input connected to said output of said ninth inverter and an output,
a seventh pass gate having an input connected to said seventh input of said inverting multiplexer, a first control input connected to said output of said seventh NAND gate, a second control input connected to said output of said tenth inverter and an output,
an eighth pass gate having an input connected to said eighth input of said inverting multiplexer, a first control input connected to said output of said eighth NAND gate, a second control input connected to said output of said eleventh inverter and an output, and
a twelfth inverter having an input connected to said output of said first, second, third, fourth, fifth, sixth, seventh and eighth pass gates and an output forming said output of said inverting multiplexer.

* * * * *